United States Patent
Le

(10) Patent No.: US 8,098,090 B2
(45) Date of Patent: Jan. 17, 2012

(54) OPEN-DRAIN OUTPUT BUFFER FOR SINGLE-VOLTAGE-SUPPLY CMOS

(75) Inventor: Hung Pham Le, San Jose, CA (US)

(73) Assignee: Exar Corporation, Fremont, CA (US)

( * ) Notice: Subject to any disclaimer, the term of this patent is extended or adjusted under 35 U.S.C. 154(b) by 0 days.

(21) Appl. No.: 12/699,239

(22) Filed: Feb. 3, 2010

(65) Prior Publication Data
US 2010/0127762 A1    May 27, 2010

Related U.S. Application Data

(63) Continuation of application No. 11/964,467, filed on Dec. 26, 2007, now Pat. No. 7,683,696.

(51) Int. Cl.
*G05F 1/10* (2006.01)
(52) U.S. Cl. .......................... 327/534; 327/535
(58) Field of Classification Search .......... 327/108–112, 327/534, 536; 326/82–87
See application file for complete search history.

(56) References Cited

U.S. PATENT DOCUMENTS

| | | | |
|---|---|---|---|
| 5,929,695 A * | 7/1999 | Chan et al. .................. | 327/537 |
| 6,429,726 B1 * | 8/2002 | Bruneau et al. .............. | 327/537 |
| 6,433,618 B1 * | 8/2002 | Bertin et al. ................ | 327/534 |
| 6,573,765 B2 * | 6/2003 | Bales et al. ................ | 327/108 |
| 7,245,177 B2 * | 7/2007 | Fujita et al. ................ | 327/543 |
| 7,683,696 B1 | 3/2010 | Le | |

OTHER PUBLICATIONS

Non-Final Office Action for U.S. Appl. No. 11/964,467, mailed on Apr. 7, 2009, 6 pages.
Notice of Allowance for U.S. Appl. No. 11/964,467, mailed on Nov. 3, 2009, 6 pages.

* cited by examiner

*Primary Examiner* — An Luu
(74) *Attorney, Agent, or Firm* — Kilpatrick Townsend & Stockton LLP; Ardeshir Tabibi

(57) ABSTRACT

An open-drain output buffer is operative to sustain relatively high voltages applied to an output pad. The open-drain buffer includes a number of floating wells, output switching devices and corresponding well-bias selectors to ensure that no gate oxide sustains voltages greater than a predefined value. PMOS and NMOS well-bias selectors operate to select and provide an available highest or lowest voltage, respectively, to bias corresponding well-regions and ensure no device switching terminals are electrically over stressed. As output related terminals experience switching related voltage excursions, the well-bias selectors select alternate terminals to continue selection of the respective highest or lowest voltages available and provide correct well-biasing conditions. Voltage dividers are incorporated to generate well-biasing control voltages. By electrical coupling across maximal voltages, the voltage dividers generate reference voltages that induce proper selection of well-bias voltages to the floating wells.

13 Claims, 1 Drawing Sheet

OPEN-DRAIN OUTPUT BUFFER FOR SINGLE-VOLTAGE-SUPPLY CMOS

CROSS-REFERENCES TO RELATED APPLICATIONS

This application is a continuation of U.S. application Ser. No. 11/964,467, filed Dec. 26, 2007, now U.S. Pat. No. 7,683,696, and entitled "Open Drain Output Buffer for Single-Voltage-Supply CMOS," which is incorporated by reference herein in its entirety.

BACKGROUND OF THE INVENTION

The present invention relates to electronic circuits, and more particularly to an open-drain output buffer adapted to operate at relatively high voltages.

To realize manufacturing and economical leverages, topological geometries of semiconductor devices have been continually scaled downward across successive product generations. Supply voltages for semiconductors have correspondingly scaled downward, at least in part, to maintain consistent working voltages across materials, such as gate oxides. Historically a 0.35 micron (μm) technology has incorporated a 3.3 Volt (V) supply voltage and correspondingly, 0.18 μm and 0.13 μm technology generations have used 1.8 V and 1.2 V supplies, respectively. Maintaining consistent maximal operating voltages is necessary to avoid over-voltage conditions across electrical terminals that expose corresponding materials to electric field magnitudes that would cause material breakdown and device failure. The challenge of maintaining operating voltages within electrical limits of material properties comes at the input and output terminals of the semiconductor device. The input and output terminals are where an operating voltage region of a first device interacts with the voltage region of a second device. The device most challenged is the one operating in a lower voltage region. During electrical switching between the two operating voltage regions, the first device, operating at the lower voltage, experiences voltage from the second voltage region that may exceed operational voltage limits of the first device. During voltage excursions to the upper logic levels of the second device, over-voltage conditions in the first device are likely to cause exposed materials to fail.

Output buffers with open-drain pull-down transistors are typically used for attachment to common buses with other transistors (usually in another package). A single voltage supply point, perhaps with a pull-up resistor to a power source, provides the highest logic level required by any switching transistor on the bus. Output buffers with open-drain pull-down transistors are commonly fabricated in complementary metal oxide semiconductor (CMOS) processes. As an output terminal of an open-drain CMOS buffer turns off, pull-down transistors are switched off and buffer terminals remain in electrical connection with the output pad. An open-drain buffer of the first transistor (as above) experiences a high voltage level corresponding to an upper logic level voltage coming from the second transistor. The magnitude of the high logic-level of the second transistor, when applied to terminals of the first transistor may provide voltages that exceed the operating voltages and maximum sustainable voltages for particular materials in the first transistor. To avoid damage, the pull-down transistors have to be maintained in a semiconductor well provided with a voltage equal to the voltage provided by the second transistor and no gate oxide of a switching transistor may be exposed to a voltage causing failure of the gate. To avoid material breakdown, transistors exposed to elevated external voltages have been placed within a well provided with voltage near the switching voltage levels.

Typically, designers have found ways of providing a biasing voltage level to a substrate well encompassing a given switching transistor exposed to a relatively higher voltage region. Presuming that no explicit connection to the higher voltage region exists for the first transistor, a designer has been faced with utilizing some means of providing a path from the external voltage source to provide biasing to a well-region isolated from the well-regions operating at the native voltage-region level. Often the isolated or floating well-region is coupled to the output pad by a coupling transistor having a conductance characteristic provided and triggered by the elevated external voltage level. The coupling transistor provides an electrical path to the floating well providing the external voltage level as a well bias. This technique has been limited to a relative voltage level of about two times the operating voltage (VDD) of the first transistor. In order to provide a broader possible range of interface voltage interactions between semiconductor transistors, a means of allowing a greater range of disparity between voltage regions being switched to-and-from would be desirable. It would also be desirable to have a way of incorporating the voltage level of the external region and yet, still incorporate the floating well principle, and at the same time allow continued use of less expensive process technologies for the implementation of the interface transistor.

BRIEF SUMMARY OF THE INVENTION

The present invention is an open-drain output buffer for electrical communication with external voltage regions and associated signaling levels substantially greater than the native supply voltage level of the buffer. The buffer is disposed between a supply voltage terminal and a ground terminal. The output buffer has, in one embodiment, three transistors coupled in series from an output pad to ground. The three transistors may be NMOS transistors configured to electrically couple the output pad to the ground terminal. In order to withstand external voltage levels in excess of the native supply voltage level, output buffer transistors exposed to the elevated voltage levels are situated within the floating wells such that no gate oxide of any transistor, in the present embodiment, is exposed to greater than a predefined value, such as 1.2 V in some embodiment.

Well-bias selectors couple to an associated one of the floating wells and provide a reverse bias voltage to the associated floating well. For the floating wells including PMOS transistors, the corresponding well-bias selectors select a highest voltage available to provide a correct reverse bias level for the included transistors. Floating wells and well bias selectors may be, as in the present embodiment, cascaded in order that elevated voltage accommodation may be additive. Cascading allows the output buffer to withstand external voltages in excess of 2 times the native supply voltage level. In a similar yet complementary fashion the well-bias selector for the floating well including NMOS transistors is configured to select and provide a reverse bias voltage that is the lesser of two available voltages. Well bias selectors are connected to input terminals that range in voltage according to electrical signaling on the output pad. As a signal level present on the output pad transitions from a low level, such as ground potential, to a high-level voltage the well bias selectors alternate selection of input bias in order to maintain either the highest

DETAILED DESCRIPTION OF THE INVENTION

Figure 1:
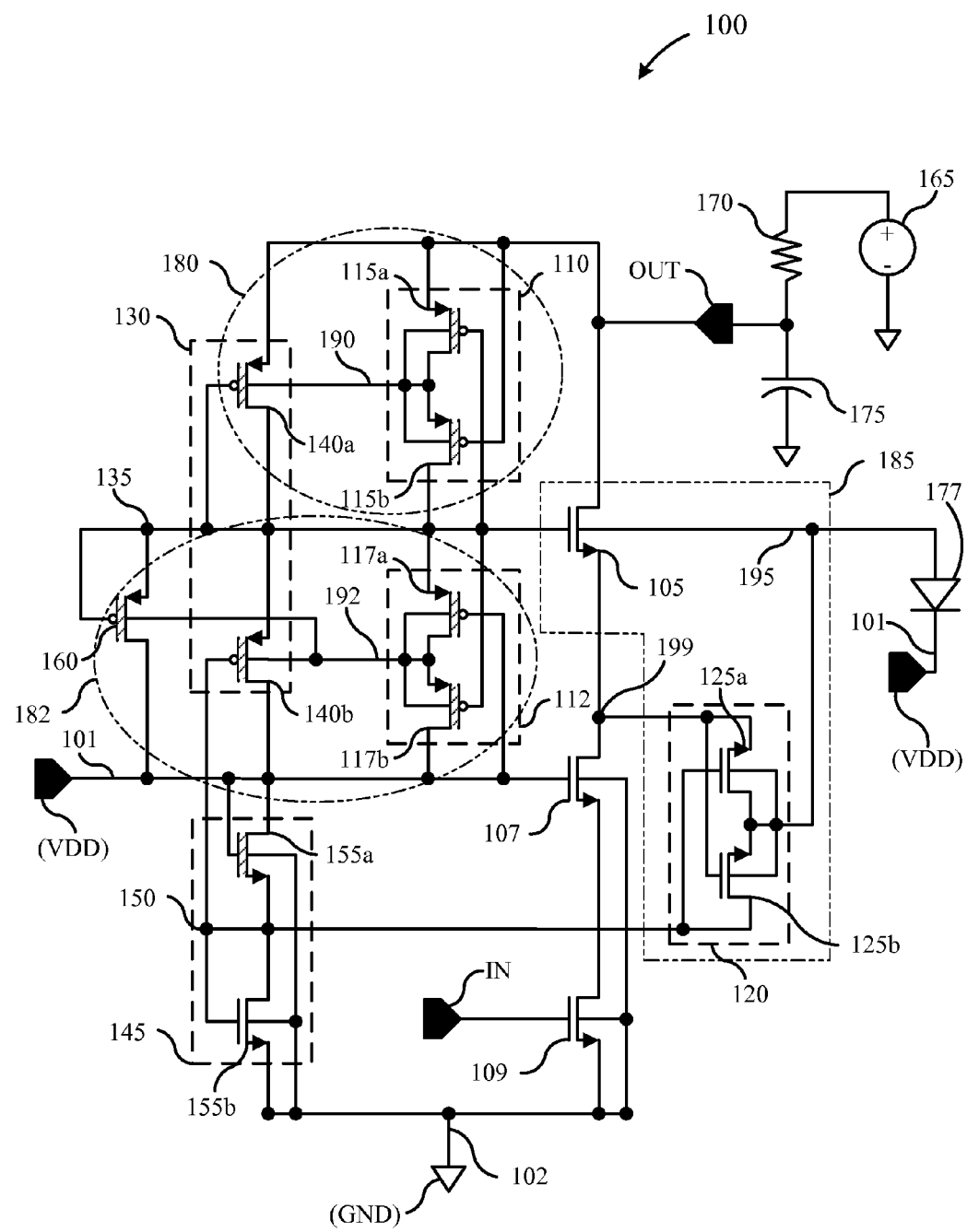
FIG. 1 is a schematic diagram of an output buffer according to one embodiment of the present invention.

FIG. 1 is a schematic diagram of an open-drain output buffer 100, in accordance with one exemplary embodiment of the present invention. Open-drain output buffer (hereinafter alternatively referred to as buffer) 100 is shown as including, in part, transistors 105, 107, and 109 disposed between output pad OUT and the ground terminal GND. Buffer 100 is also shown as including voltage dividers 130, 145, and bias selectors 110, 112, and 120. As described further below, buffer 100 is adapted to receive relatively high voltages, e.g., 3.3 v, at output pad OUT while maintaining proper voltages, e.g., 1.2 v, between the terminals of each of the transistors disposed in buffer 100. With reference to FIG. 1, an output terminal of transistor 105 couples to output pad OUT in an exemplary embodiment of buffer 100. Transistor 105, transistor 107, and transistor 109 couple in series between output pad OUT and ground terminal 102. A gate input terminal of transistor 107 couples to supply-voltage terminal 101. A gate input terminal of transistor 109 couples to input pad IN.

Voltage-divider 130 couples between output pad OUT and supply-voltage terminal 101. Voltage-divider 130 includes transistors 140a, 140b, and output terminal 135. Native transistors are used where a low threshold improves biasing response for voltage dividers or well-bias selectors (further described below). The lower threshold voltage ensures that the voltage divider or well-bias selector is enabled and provides a reverse bias voltage to an associated floating-well as soon as possible. Native transistors are shown including a diagonal pattern in channel regions. A source terminal of transistor 140a couples to output pad OUT. A gate terminal and a drain terminal of transistor 140a couple to output terminal 135. A source terminal of transistor 140b couples to output terminal 135. A drain terminal of transistor 140b couples to supply-voltage terminal 101. Output terminal 135 couples to a gate terminal of transistor 105.

Voltage-divider 145 couples between supply-voltage terminal 101 and ground terminal 102. Voltage-divider 145 includes transistor 155a, transistor 155b, and voltage-divider-output terminal 150. A drain terminal and a gate terminal of transistor 155a couple to supply-voltage terminal 101. A source terminal of transistor 155a couples to voltage-divider-output terminal 150. A drain terminal and a gate terminal of transistor 155b couple to voltage-divider-output terminal 150. A source terminal of transistor 155b couples to ground terminal 102. A bulk terminal of transistor 155a and a bulk terminal of transistor 155b couple to ground terminal 102.

Well-bias selector 110 is coupled between output pad OUT and output terminal 135. Well-bias selector 110 includes transistors 115a, 115b, and well-bias terminal 190. A source terminal of transistor 115a and a gate terminal of transistor 115b couple to output pad OUT. A drain terminal of transistor 115a and a source terminal of transistor 115b couple to well-bias terminal 190. A drain terminal of transistor 115b and a gate terminal of transistor 115a couple to output terminal 135.

Well-bias selector 112 is coupled between output terminal 135 and supply-voltage terminal 101. Well-bias selector 112 includes transistors 117a, 117b, and well-bias terminal 192. A source terminal of transistor 117a and a gate terminal of transistor 117b couple to output terminal 135. A drain terminal of transistor 117a and a source terminal of transistor 117b couple to well-bias terminal 192. A drain terminal of transistor 117b and a gate terminal of transistor 117a are coupled to supply-voltage terminal 101.

Transistor 160 is coupled between output terminal 135 and supply-voltage terminal 101. A gate terminal and a source terminal of transistor 160 couple to output terminal 135. A drain terminal of transistor 160 couples to supply-voltage terminal 101.

Well-bias selector 120 couples between an intermediate output terminal 199 and voltage-divider-output terminal 150. Well-bias selector 120 includes transistors 125a, 125b, and well-bias terminal 195. A source terminal of transistor 125a and a gate terminal of transistor 125b are coupled to intermediate output terminal 199. A drain terminal of transistor 125a and a source terminal of transistor 125b are coupled to well-bias terminal 195. A drain terminal of transistor 125b and a gate terminal of transistor 125a are coupled to voltage-divider-output terminal 150.

Resistor 170 couples in series with source 165 between output pad OUT and ground terminal 102. Capacitor 175 is coupled between output pad OUT and ground terminal 102. Diode 177 couples between well-bias terminal 195 and supply-voltage terminal 101.

With continuing reference to FIG. 1, floating-well 180 includes transistors 140a, 115a, and 115b in the exemplary embodiment of the buffer 100. Floating-well 182 includes transistors 140b, 117a, 117b, and 160. Floating-well 185 includes transistors 105, 125a, and 125b. Floating-well 180, floating-well 182, and floating-well 185 delineate floating-well regions with corresponding transistors.

With continuing reference to FIG. 1, source 165 represents an external voltage region that the buffer 100 may be electrically coupled to. In one embodiment, source 165 may be 3.3 V. The buffer 100 may be coupled to source 165 at a level of 3.3 V and yet ensure that no two terminals sustain more than 1.2 V when the external voltage equals 3.3 V. In particular, buffer 100 ensures that no gate oxide of any transistor is exposed to a voltage equal to or greater than 1.2 V. By maintaining a gate voltages at 1.2 V or less, gate oxide breakdown is avoided. By maintaining no more than 1.2 V across any oxide, stacking of a succession of transistors within floating wells allows the buffer to be attached to external voltage regions more than two times the magnitude of the supply voltage on supply-voltage terminal 101. The magnitude of voltage on supply-voltage terminal 101 is, for example, 1.2 V.

Devices of the buffer 100 are, for example, all within a single semiconductor substrate and within a single native voltage region provided by the 1.2 V magnitude on supply-voltage terminal 101. A plurality of the buffer 100 may be implemented within the same semiconductor and may be used to implement an output bus, for example. Other voltage regions may be available on a substrate where buffer 100 may be implemented. Buffer 100 alleviates the need for an additional voltage reference to be available on the same substrate. Electrical coupling to external voltages between 1.2 V and 3.3 V by buffer 100 are possible. An open-drain-output buffer, such as the buffer 100, provides an electrical pull-down capability and relies on the voltage level provided by source 165 for logic levels at an elevated voltage.

As an input voltage, applied to input pad IN, varies from a low-level (i.e., about 0 V) to a high-level (i.e., about 1.2 V), transistor 105, transistor 107, and transistor 109 are activated (turned on) and pull output pad OUT to a low-level. On the other hand, as an input voltage to the buffer 100 varies from a high-level to a low-level, transistor 109 is deactivated and allows the voltage provided by source 165 to pull output pad OUT to a high-level. In this way, the buffer 100 is able to provide electronic signaling between to regions operating at different supply voltage levels (i.e., each voltage region with a corresponding supply-voltage VDD).

In continuing reference to FIG. 1, when transistors 105, 107, and 109 are off, output pad OUT is at the external-voltage of source 165. The external voltage is provided from output pad OUT to voltage-divider 130 at the source terminal of transistor 140a. The gate terminal of transistor 140b is at a second voltage-divider-output voltage level (not shown) provided on voltage-divider-output terminal 150 (discussed in further detail below). The second voltage-divider-output voltage generates an activating gate-source voltage on transistor 140b. With an activated channel, transistor 140b conducts current between output terminal 135 and supply-voltage terminal 101. The gate terminal of transistor 140a (which is coupled to output terminal 135) therefore provides an activating gate-source voltage on transistor 140a. Transistor 140a and transistor 140b are activated and provide a voltage divider effect of external-voltage and supply-voltage VDD and generate a first voltage-divider-output voltage (not shown) on output terminal 135. For an external-voltage of 3.3 V the first voltage-divider-output voltage may be about 2.1 V.

External-voltage is provided from output pad OUT to well-bias selector 110 at the source terminal of transistor 115a. The gate terminal of transistor 115a is coupled to output terminal 135. Due to a voltage-divider effect generated by voltage-divider 130 (discussed above) on output terminal 135, an activating gate-source voltage is provided to transistor 115a. Transistor 115a conducts and provides external-voltage to well-bias terminal 190. By electrical coupling, well-bias terminal 190 provides external-voltage to floating-well 180. Transistor 140a receives a bulk terminal voltage from floating-well 180. With the external voltage level provided to floating-well 180 and with the voltage-divider characteristic of voltage-divider 130, none of the terminals of transistor 115a, transistor 115b, or transistor 140a experience greater than a 1.2 V difference and thus no over voltage condition occurs.

With a 1.2 V level on supply-voltage terminal 101 and 3.3 V on output pad OUT, the voltage on output terminal 135 is about 2.1 V. Some variation in the magnitude of the voltage on output terminal 135 from the 2.1 V would occur due to voltage drops through conductive devices and electrical paths involved in the biasing as described.

With the gate terminal of transistor 115b coupled to output pad OUT and therefore at the elevated external voltage level and with the source terminal of transistor 115b coupled to the elevated external voltage level provided on well-bias terminal 190, a deactivating gate-source voltage exists on transistor 115b. With transistor 115a on (conducting) and transistor 115b off, well-bias selector 110 provides the higher level of the two voltages (i.e., external-voltage and a first voltage-divider-output voltage) to well-bias terminal 190.

The first voltage-divider-output voltage is provided from output terminal 135 to well-bias selector 112 at the source terminal of transistor 117a. The gate terminal of transistor 117a is coupled to supply-voltage terminal 101. Due to a voltage-divider effect generated by voltage-divider 130 (discussed above) on output terminal 135, an activating gate-source voltage is provided to transistor 117a. Transistor 117a conducts and provides the first voltage-divider-output voltage level to well-bias terminal 192. By electrical coupling, well-bias terminal 192 provides the first voltage-divider-output voltage level to floating-well 182.

Transistor 140b receives a bulk terminal voltage from floating-well 182. With the first voltage-divider-output voltage (2.1 V) provided to floating-well 182 and the voltage-divider characteristic of voltage-divider 130 operative with the first voltage-divider-output voltage and supply-voltage VDD at 1.2 V, none of the terminals of transistor 117a, transistor 117b, transistor 140b, or transistor 160 experience greater than a 1.2 V difference between them and thus no over voltage condition occurs.

With the gate terminal of transistor 117b coupled to output terminal 135 and therefore at the first voltage-divider-output voltage level and with the source terminal of transistor 117b coupled to the first voltage-divider-output voltage provided on well-bias terminal 192, a deactivating gate-source voltage exists on transistor 117b and the transistor is off. With transistor 117a on (conducting) and transistor 117b off, well-bias selector 112 provides the higher level of the two voltages (i.e., the first voltage-divider-output voltage and supply-voltage VDD) to well-bias terminal 192.

Supply-voltage VDD is provided from supply-voltage terminal 101 to voltage-divider 145 at the drain terminal of transistor 155a. The gate terminal of transistor 155a is at supply-voltage level VDD. Supply-voltage level VDD generates an activating gate-source voltage on transistor 155a and allows the channel of transistor to conduct. With an activated channel of transistor 155a conducting between voltage-divider-output terminal 150 and supply-voltage terminal 101, the gate terminal of transistor 155b (which is coupled to voltage-divider-output terminal 150) provides an activating gate-source voltage on transistor 155b. Transistor 155a and transistor 155b are therefore activated and provide a voltage divider effect of supply-voltage VDD and Ground GND to generate voltage-divider-output voltage (not shown) on voltage-divider-output terminal 150. The device-threshold of transistor 155a and transistor 155b may be configured such that voltage-divider-output voltage is, for example, about 0.9 V for operation in a voltage region with supply-voltage VDD of 1.2 V and an external-voltage of about 3.3 V.

The second voltage-divider-output voltage level is provided to well-bias selector 120 at the drain terminal of transistor 125b. As discussed above, the first voltage-divider-output voltage is about 2.1 V and is provided as the gate terminal voltage on transistor 105. The intermediate output voltage therefore, may rise to a level about one NMOS device-threshold voltage below the first voltage-divider-output voltage or about 1.8-1.9 V. With the gate terminal of transistor 125b coupled to the source terminal of transistor 105 and therefore at a voltage level equal to the intermediate output voltage level minus one NMOS device-threshold voltage and with the drain terminal of transistor 125b at voltage-divider-output voltage, transistor 125b is on. Transistor 125b conducts and provides a low-level output voltage on voltage-divider-output terminal 150 to well-bias terminal 195. By electrical coupling, well-bias terminal 195 provides the low-level voltage from voltage-divider-output terminal 150 to floating-well 185. Transistor 105 receives a bulk terminal voltage from floating-well 185.

With the gate terminal of transistor 125a coupled to voltage-divider-output terminal 150 and therefore at voltage-divider-output voltage level of 0.9 V and with the source terminal of transistor 125a coupled to the intermediate output voltage provided on intermediate output terminal 199 at about 1.8-1.9 V, a deactivating gate-source voltage exists on transistor 125a and the transistor is off. With transistor 125b on (conducting) and transistor 125a off, well-bias selector 120 provides the lower level of the two voltages (i.e., voltage-divider-output voltage and the intermediate output voltage) to well-bias terminal 195.

With voltage-divider-output voltage level provided to floating-well 185 and with the voltage-divider characteristic of voltage-divider 145, none of the gate oxide related terminals of transistor 125a, transistor 125b, or transistor 105 experience greater than a 1.2 V difference between them and thus no over voltage condition on any of the gate oxides occurs. The drain terminal of transistor 105 is electrically coupled to external-voltage (3.3 V) on output pad OUT but is encompassed by voltage-divider-output voltage (0.9 V) provided to floating-well 185. In this way, the drain terminal of transistor 105 is provided with a well-bias at the lower bias control voltage available through well-bias selector 120. It is acceptable to subject a semiconductor junction within a transistor to a voltage difference greater than the magnitude of supply-voltage VDD, which for example is 1.2 V. Yet, the gate oxide of transistors; i.e. any gate-to-source, gate-to-drain, or gate-to-bulk connection; is not to be exposed to a voltage difference greater than 1.2 V, for example.

In continuing reference to FIG. 1, with a high-level voltage applied to the gate terminal of transistor 109 and with the source terminal coupled to Ground GND, transistor 109 is on and conducts to a 0 V level on Ground GND. The drain terminal of transistor 109 and therefore the source terminal of transistor 107 are pull-down to 0 V. With the gate terminal of transistor 107 coupled to supply-voltage VDD, transistor 107 receives an activating gate-source voltage and conducts, pulling the drain terminal of transistor 107 to 0 V.

The gate terminal of transistor 140b is at a second voltage-divider-output voltage level provided on voltage-divider-output terminal 150 (discussed above). With the source terminal of transistor 140b at supply-voltage VDD on supply-voltage terminal 101 and the gate terminal of transistor 140b coupled to voltage-divider-output terminal 150, voltage-divider-output voltage generates an activating gate-source voltage on transistor 140b. With an activated channel, transistor 140b conducts and provides supply-voltage VDD from supply-voltage terminal 101 to output terminal 135. Output terminal 135 provides supply-voltage VDD to the gate terminal of transistor 105 and transistor 107 conducting, provides 0 V to the source terminal of transistor 105. Transistor 105 therefore, receives an activating gate-source voltage.

With a high-level voltage applied to the gate terminals of transistors 105, 107, and 109, a low-level voltage of about 0 V is provided through transistor 105, transistor 107, and transistor 109 to output pad OUT. Note that with supply-voltage VDD the highest voltage provided, the source-drain definitions of the PMOS transistors reverse in a complementary biasing context. The low-level voltage is provided from output pad OUT to voltage-divider 130 at the drain terminal of transistor 140a. The gate terminal of transistor 140a (which is coupled to output terminal 135) therefore receives a deactivating gate-source voltage for transistor 140a. With transistor 140a off and transistor 140b on, supply-voltage VDD is provided on output terminal 135. Supply-voltage VDD is also provided to the gate terminal of transistor 105, ensuring the device remains on.

With the gate terminal of transistor 115b coupled to output pad OUT and therefore at the low-level voltage and with the source terminal (formerly the drain terminal in the previous complementary biased configuration) of transistor 115b coupled to supply-voltage VDD on output terminal 135, an activating gate-source voltage exists on transistor 115b. Transistor 115b conducts and provides supply-voltage VDD to well-bias terminal 190. By electrical coupling, well-bias terminal 190 provides supply-voltage VDD to floating-well 180. Transistor 140a receives a bulk terminal voltage (i.e., the native VDD) from floating-well 180.

The low-voltage level is provided from output pad OUT to well-bias selector 110 at the drain terminal of transistor 115a. The gate terminal of transistor 115a is coupled to output terminal 135. With supply-voltage VDD on output terminal 135, a deactivating gate-source voltage is provided to transistor 115a and the device is off (nonconducting).

With supply-voltage VDD provided to floating-well 180, none of the terminals of transistor 115a, transistor 115b, or transistor 140a experience greater than a 1.2 V difference between them and thus no over voltage condition occurs. With transistor 115b on (conducting) and transistor 115a off, well-bias selector 110 provides the higher level of the two voltages (i.e., selects the first voltage-divider-output voltage instead of the low-level voltage) to well-bias terminal 190.

With the gate terminal of transistor 117b coupled to output terminal 135 and therefore at supply-voltage VDD and with the source terminal of transistor 117b coupled to supply-voltage terminal 101, a deactivating gate-source voltage exists on transistor 117b and the device is off. With transistor 117a off (nonconducting) and transistor 117b off, well-bias selector 112 leaves well-bias terminal 192 floating.

The first voltage-divider-output voltage is provided from output terminal 135 to well-bias selector 112 at the drain terminal of transistor 117a. The gate terminal of transistor 117a is coupled to supply-voltage terminal 101. With supply-voltage VDD on output terminal 135, a deactivating gate-source voltage is provided to transistor 117a, turning the device off.

With well-bias terminal 192 floating and supply-voltage terminal 101 and output terminal 135 both at supply-voltage VDD, the gate terminals of transistor 105 and transistor 107 are provided with activating gate-source voltages and conduction of both devices is assured.

Supply-voltage VDD is provided from supply-voltage terminal 101 to voltage-divider 145 at the drain terminal of transistor 155a as described above. All connections and the operation of voltage-divider 145 remain as described above.

Well-bias selector 120, transistor 125a, and transistor 125b provide a reverse-bias voltage on well-bias terminal 195, which comes from either intermediate output terminal 199 or voltage-divider-output terminal 150, whichever is lower. The well-bias and therefore bulk terminals of transistor 105, transistor 125a, and transistor 125b are provided with the lowest potential these devices are exposed to on conducting channel terminals. When transistor 105 is turned on, intermediate output terminal 199 is close to GND, hence the well of transistor 105 is at GND also. When transistor 105 is turned off, intermediate output terminal 199 goes up to 1.8-1.9, hence the voltage on well-bias terminal 195 is equal to the voltage on voltage-divider-output terminal 150, which is about 0.9. If transistor 105 is either on or off, all transistors in floating well 185 experience no more than 1.2 v across in the gate oxide.

An intermediate output voltage level, i.e., the low-level voltage, is provided from intermediate output terminal 199 to well-bias selector 120 at the source terminal of transistor 125a. The gate terminal of transistor 125a is coupled to voltage-divider-output terminal 150. Due to a voltage-divider effect generated by voltage-divider 145 (discussed above) voltage-divider-output voltage generates an activating gate-source voltage on transistor 125a allowing the device to conduct. Transistor 125a conducts and provides the intermediate output voltage level (a low-voltage approximately equal to, for example, 0 V) to well-bias terminal 195. By electrical coupling, well-bias terminal 195 provides the intermediate output voltage level to floating-well 185. Transistor 105 receives a bulk terminal voltage from floating-well 185. With the intermediate output voltage level provided to floating-well 185 and with the voltage-divider characteristic of voltage-divider 145, none of the terminals of transistor 125a, transistor 125b, or transistor 105 experience greater than a 1.2 V difference between them and thus no over voltage condition occurs.

The Diode 177 coupled between well-bias terminal 195 and supply-voltage terminal 101 represents a junction formed by an n-type well that includes floating-well 185. The n-type well is biased to supply-voltage VDD and isolates floating-well 185 from a common p-type substrate.

As in the various discussions above and with a 1.2 V level on supply-voltage terminal 101 and 0 V on ground terminal 102, and the voltage on voltage-divider-output terminal 150 is about 0.9 V. Some variation in the magnitude of the voltage on voltage-divider-output terminal 150 from the 0.9 V would occur due to voltage drops through conductive devices and electrical paths involved in the biasing as described.

Various exemplary embodiments of switches have been given, where a switch has been presented, alternatively, as an NMOS or a PMOS transistor. As one skilled in the art will readily appreciate, further alternative embodiments of switches exist. For example switches within a semiconductor substrate may be fabricated as JFETs or IGFETs transistors for example. The exemplary embodiments referenced above should be incorporated for alternative means for implementing the embodiments and not seen as a restriction to interpretation of the present invention.

What is claimed is:

1. An output buffer disposed between a supply voltage terminal and a ground terminal, the output buffer comprising:
    a plurality of transistors coupled to an output pad and configured to electrically couple the output pad to the ground terminal;
    a plurality of well-bias selectors each coupled to an associated one of a plurality of floating wells, the plurality of well-bias selectors configured to select and provide a respective reverse well-bias voltage to the associated one of the plurality of floating wells; and
    a plurality of voltage dividers each coupled to an associated one of the plurality of well-bias selectors and configured to generate a respective well-bias-reference voltage;
    wherein the plurality of transistors comprises a first transistor, a second transistor, and a third transistor, the first, second, and third transistors being coupled in series.

2. The output buffer of claim 1, wherein the first transistor has a first current carrying terminal coupled to the output pad, a gate terminal coupled to a first node, a second current carrying terminal coupled to a second node, and a body terminal coupled to a first floating well, wherein the second transistor has a first current carrying terminal coupled to the second node, and a gate terminal coupled to the supply voltage, wherein the third transistor has a first current terminal coupled to the second current carrying terminal of the second transistor, a second current carrying terminal coupled to the ground terminal, and a gate terminal receiving an input voltage, wherein body terminals of the second transistor and the third transistor are coupled to the ground terminal.

3. The output buffer of claim 2, wherein the first, second and third transistors are NMOS transistors.

4. The output buffer of claim 3 wherein each of the plurality of well-bias selectors further comprises a first transistor and a second transistor, wherein a gate terminal of the first transistor of a well-bias selector is coupled to a first current carrying terminal of the second transistor of the well-bias selector, wherein a gate terminal of the second transistor of the well-bias selector is coupled to a first current carrying terminal of the first transistor of the well-bias selector, wherein a body terminal of the first transistor of the well-bias selector is coupled to a body terminal of the second transistor of the well-bias selector, to a corresponding floating well and to second current carrying terminals of the first transistor and the second transistor of the well-bias selector.

5. The output buffer of claim 4, wherein the first and the second transistors disposed in at least one of the well-bias selectors are native PMOS transistors and the corresponding floating well is a semiconductor region having n-type dopants.

6. The output buffer of claim 5, wherein the first and the second transistors disposed in at least one of the well-bias selectors are NMOS transistors and the corresponding floating well is a semiconductor region having p-type dopants.

7. The output buffer of claim 6 wherein a first one of the plurality of well-bias selectors is coupled between the output pad and the gate terminal of the first transistor of the output buffer, and wherein a second one of the plurality of well-bias selectors is coupled between the gate terminals of the first and second transistors of the output buffer.

8. The output buffer of claim 7 wherein a first voltage divider is coupled between the supply voltage terminal and the ground terminal, wherein said first voltage divider comprises a first transistor and a second transistor, wherein gate and drain terminals of the first transistor of the first voltage divider are coupled to the supply voltage terminal, wherein a source terminal of the first transistor of the first voltage divider and gate and drain terminals of the second transistor of the first voltage divider are coupled to an output terminal of the first voltage divider, and wherein body terminals of the first transistor and a second transistor of the first voltage divider are coupled to the ground terminal.

9. The output buffer of claim 8, wherein the first and the second transistors disposed in the first voltage divider are NMOS transistors.

10. The output buffer of claim 9, wherein the second transistor disposed in the first voltage divider is a native NMOS transistor.

11. The output buffer of claim 10, wherein a second voltage divider is coupled between the supply voltage terminal and the output pad, wherein the second voltage divider comprises a first transistor and a second transistor, wherein a gate terminal of the first transistor of the second voltage divider is coupled to the output terminal of the first voltage divider and a first current carrying terminal of the first transistor is coupled to the supply voltage terminal, wherein a drain terminal of the first transistor of the second voltage divider and a gate and drain terminals of the second transistor of the second voltage divider are coupled to an output terminal of the second voltage divider, wherein a source terminal of the second transistor of the second voltage divider is coupled to the output pad, wherein a body terminal of the first transistor of the second voltage divider is coupled to a second floating well, and wherein the body terminal of the second transistor of the second voltage divider is coupled to the first floating well.

12. The output buffer of claim 11, wherein the first and the second transistors disposed in the second voltage divider are native PMOS transistors.

13. The output buffer of claim 12 further comprising a PMOS transistor having gate and source terminals coupled to the first node and a drain terminal coupled to the supply voltage.

* * * * *